(12) United States Patent
Iyoda et al.

(10) Patent No.: US 10,698,304 B2
(45) Date of Patent: Jun. 30, 2020

(54) COOLING DEVICE, PROJECTOR, AND HEAT RECEIVING UNIT

(71) Applicant: Panasonic Intellectual Property Management Co., Ltd., Osaka (JP)

(72) Inventors: Makoto Iyoda, Osaka (JP); Ichiro Kano, Yamagata (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/195,196

(22) Filed: Nov. 19, 2018

(65) Prior Publication Data

US 2019/0086777 A1 Mar. 21, 2019

Related U.S. Application Data

(63) Continuation of application No. PCT/JP2017/014332, filed on Apr. 6, 2017.

(30) Foreign Application Priority Data

May 23, 2016 (JP) ................................ 2016-102881

(51) Int. Cl.
*G03B 21/16* (2006.01)
*G03B 21/00* (2006.01)
(Continued)

(52) U.S. Cl.
CPC ........... *G03B 21/16* (2013.01); *F28D 15/025* (2013.01); *F28D 15/0266* (2013.01);
(Continued)

(58) Field of Classification Search
CPC .... G03B 21/16; G03B 21/00; G03B 21/2033; F28D 15/025; F28D 15/0266;
(Continued)

(56) References Cited

U.S. PATENT DOCUMENTS 9,778,709 B2 * 10/2017 So ............................ G06F 1/20
2003/0205054 A1 11/2003 Nori et al.
(Continued)

FOREIGN PATENT DOCUMENTS

JP   2009-122385   6/2009
JP   2011-165760   8/2011
(Continued)

OTHER PUBLICATIONS

International Search Report dated Jun. 20, 2017 in corresponding International Application No. PCT/JP2017/014332.

*Primary Examiner* — Jerry L Brooks
(74) *Attorney, Agent, or Firm* — Wenderoth, Lind & Ponack, L.L.P.

(57) ABSTRACT

A cooling device includes a heat receiving unit, a working fluid, a radiator, and a pump. The heat receiving unit includes a first member, a second member, an inlet housing, and an outlet housing. The first member receives heat. The second member is disposed to face the first member. The inlet housing is connected to the pump and disposed between the first member and the second member. The outlet housing is connected to the radiator and disposed on a side of the second member facing away from the inlet housing. The first member and the second member are disposed at a predetermined distance away from each other. A vaporization space portion is disposed between the first member and the second member. An outlet space portion is disposed on a side of the second member facing away from the vaporization space portion.

7 Claims, 10 Drawing Sheets

(51) Int. Cl.
*F28D 15/02* (2006.01)
*G03B 21/20* (2006.01)
*H05K 7/20* (2006.01)
*H01L 23/427* (2006.01)

(52) U.S. Cl.
CPC ......... *G03B 21/00* (2013.01); *G03B 21/2033* (2013.01); *H05K 7/20309* (2013.01); *H05K 7/20327* (2013.01); *H01L 23/427* (2013.01)

(58) Field of Classification Search
CPC ........... H05K 7/20309; H05K 7/20327; H05K 7/2033; H01L 23/427
USPC ......................................................... 353/54
See application file for complete search history.

(56) References Cited

U.S. PATENT DOCUMENTS

2011/0001937 A1* 1/2011 Matsumoto ............ G03B 21/16
353/54
2011/0194578 A1 8/2011 Hirose et al.

FOREIGN PATENT DOCUMENTS

| JP | 2012-26721 | 2/2012 |
| WO | 02/46677 | 6/2002 |

* cited by examiner

COOLING DEVICE, PROJECTOR, AND HEAT RECEIVING UNIT

TECHNICAL FIELD

The present disclosure relates to a cooling device used to cool a heating element, such as a semiconductor that generates laser oscillation, a projector including the cooling device, and a heat receiving unit used in the cooling device.

BACKGROUND ART

Conventionally, cooling devices employing air cooling are included in electronic devices, for example. In the air cooling, a heat sink is attached to a heating element, such as a central processing unit (CPU), and air generated by a fan is blown onto the heat sink to cool the heating element. There are also cooling devices that use water cooling. In the water cooling, a radiator cools a working fluid warmed by heat received from a heating element, and the cooled working fluid is returned to a place where the cooled working fluid is to receive heat again.

Air cooling or simple water cooling may sometimes be insufficient to cool heating elements that are included in electronic devices with enhanced functionality and high output power, for example, and that generate a great amount of heat. Thus, cooling devices utilizing latent heat of vaporization, such as a cooling device described in Unexamined Japanese Patent Publication No. 2012-26721, have been proposed. These cooling devices utilize latent heat of vaporization required for a working fluid to change from a liquid phase to a gas phase, to cool a heating element with high efficiency.

SUMMARY OF THE INVENTION

A cooling device according to the present disclosure includes: a heat receiving unit configured to receive heat from a heating element; a working fluid transferring the heat received by the heat receiving unit; a radiator configured to cool the working fluid from the heat receiving unit; and a pump configured to transport, to the heat receiving unit, the working fluid discharged from the radiator. The heat receiving unit includes: a first member configured to receive the heat from the heating element and vaporize the working fluid; a second member disposed to face the first member and having slits disposed in the second member; an inlet housing connected to the pump and disposed between the first member and the second member; and an outlet housing connected to the radiator and disposed on a side of the second member facing away from the inlet housing. The first member and the second member are disposed at a predetermined distance away from each other, and a vaporization space portion is disposed between the first member and the second member. An outlet space portion is disposed on a side of the second member facing away from the vaporization space portion.

A heat receiving unit according to the present disclosure is connected to a pump and configured to cool a heating element by using a working fluid. The heat receiving unit includes: a first member configured to receive heat from the heating element and vaporize the working fluid; a second member disposed to face the first member and having slits disposed in the second member; an inlet housing connected to the pump and disposed between the first member and the second member; and an outlet housing into which the working fluid is discharged. The outlet housing is disposed on a side of the second member facing away from the inlet housing. The first member and the second member are disposed at a predetermined distance away from each other, and a vaporization space portion is disposed between the first member and the second member. An outlet space portion is disposed on a side of the second member facing away from the vaporization space portion.

As described above, the cooling device, the projector, and the heat receiving unit according to the present disclosure achieve high cooling efficiency.

DESCRIPTION OF EMBODIMENTS

With reference to the drawings, the following describes exemplary embodiments of a cooling device, and a heat receiving unit used in the cooling device, according to the present disclosure. The exemplary embodiments described below merely illustrate examples of the cooling device, and the heat receiving unit used in the cooling device, according to the present disclosure. Accordingly, the scope of the present disclosure is defined by wording of claims with reference to the following exemplary embodiments, and is not limited only to the following exemplary embodiments. Thus, of the components in the following exemplary embodiments, components not recited in the independent claim indicating the broadest concept of the present invention are not necessarily required for achieving an object of the present invention, but are described as components constituting preferred embodiments.

The drawings are schematic views to which enhancement, omission, and ratio adjustment have been made as appropriate in order for the drawings to illustrate the present disclosure, and thus shapes, positional relationships, and ratios may differ from actual ones.

First Exemplary Embodiment

Figure 1:
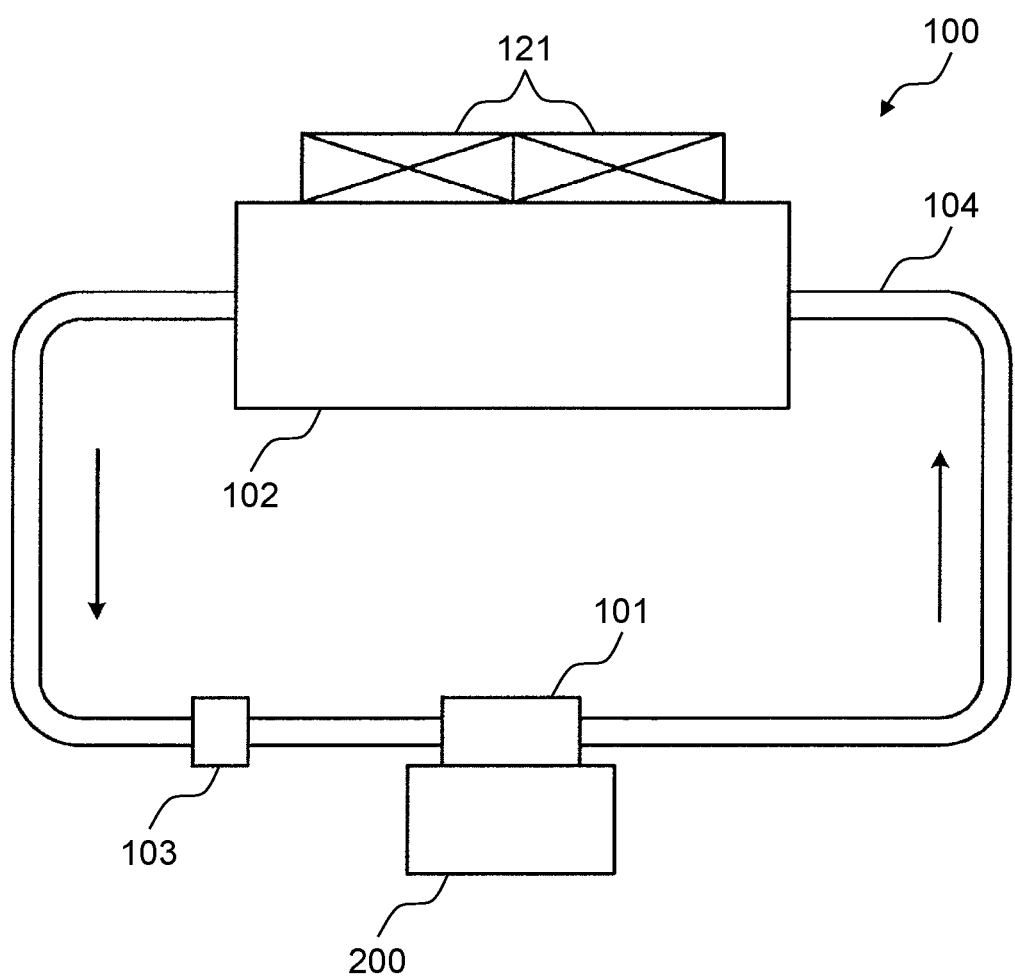
FIG. 1 illustrates a circuit configuration of a cooling device according to a first exemplary embodiment.

FIG. 1 illustrates a circuit configuration of a cooling device. As illustrated in FIG. 1, cooling device 100 is a system in which heat generated by heating element 200 is dissipated in a predetermined area to cool heating element 200. Cooling device 100 includes heat receiving unit 101, radiator 102, pump 103, and pipe member 104 that guides a working fluid.

The term "working fluid" as used herein means any fluid that transfers heat, and, in the specification and the claims, includes any fluid in a liquid state, a gaseous state, and a state of gas-liquid mixture.

Radiator 102 is a heat exchanger that exchanges heat between a working fluid flowing internally and a fluid brought into contact with outside. In radiator 102, a vaporized working fluid liquefies. Thus radiator 102 also functions as a condenser.

In the present exemplary embodiment, radiator 102 includes a plurality of thin pipes (not shown) disposed at predetermined intervals, and fans 121 that cause air to flow between the thin pipes. Radiator 102 is capable of heat exchange between the air and a divided working fluid flowing in the respective thin pipes, to thereby cool the working fluid and liquefy the vaporized working fluid.

Pump 103 is a device that forces the working fluid from radiator 102 into heat receiving unit 101 through pipe member 104. Pump 103 is provided in pipe member 104, and, in FIG. 1, is positioned in such a part as to pump the working fluid from radiator 102 to heat receiving unit 101. Pump 103, however, may be positioned in such a part of pipe member 104 as to return the working fluid from heat receiving unit 101 to radiator 102. Power of pump 103 is not limited to any particular pumping power, but may be determined according to an amount of heat generated by heating element 200 and capacity of radiator 102, for example. In the present exemplary embodiment, heating element 200 is a laser source provided in a projector (which will be described later). The power of pump 103 used to cool such heating element 200 is preferably selected from a range from 5 ml/min to 100 ml/min, inclusive. If the power of pump 103 is less than 5 ml/min, sufficient cooling capacity would not be provided. On the other hand, if the power of pump 103 exceeds 100 ml/min, vaporization of the working fluid would be inhibited, and desired cooling power is not achieved.

Figure 2:
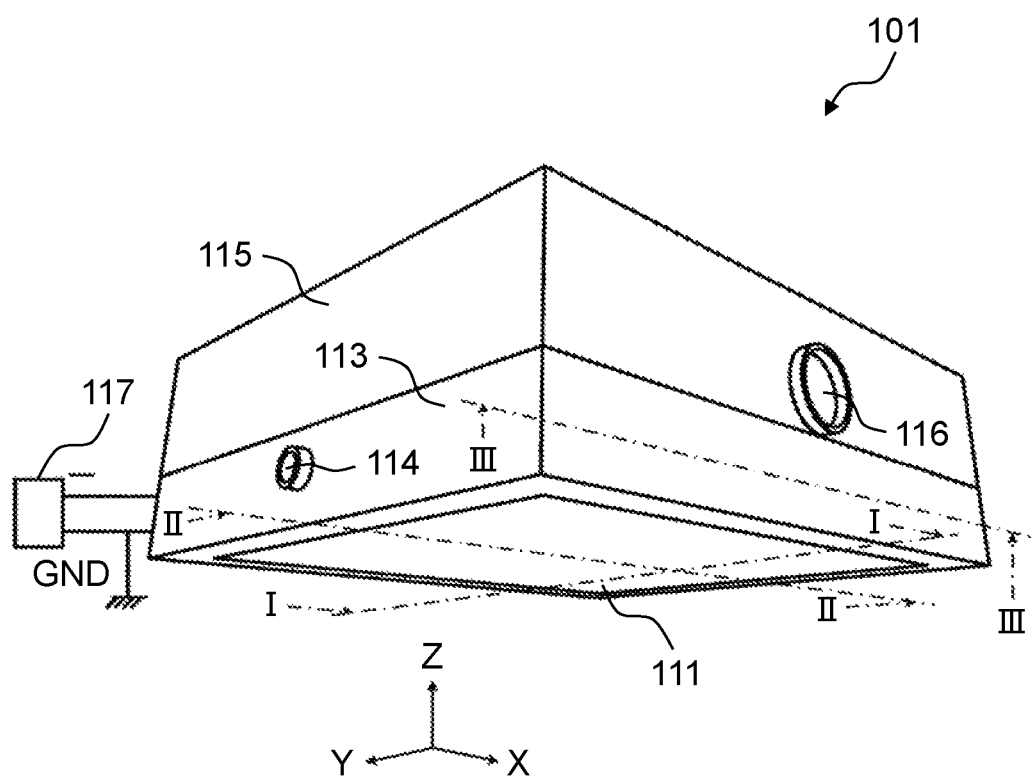
FIG. 2 is a perspective view illustrating an appearance of a heat receiving unit according to the first exemplary embodiment.

FIG. 2 is a perspective view illustrating an appearance of the heat receiving unit.

Figure 3:
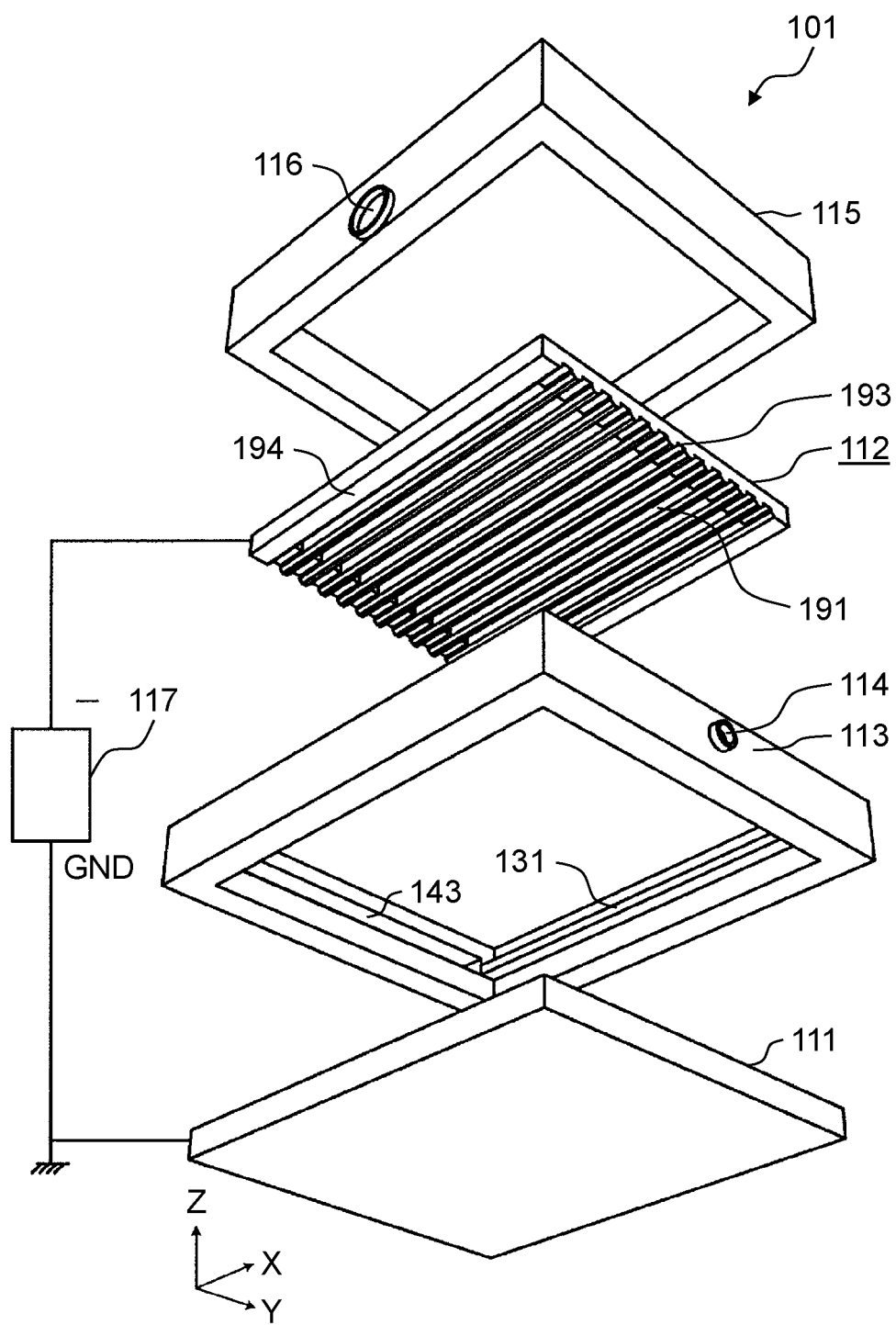
FIG. 3 is an exploded perspective view illustrating the heat receiving unit according to the first exemplary embodiment.

FIG. 3 is an exploded perspective view illustrating the heat receiving unit.

Figure 4:
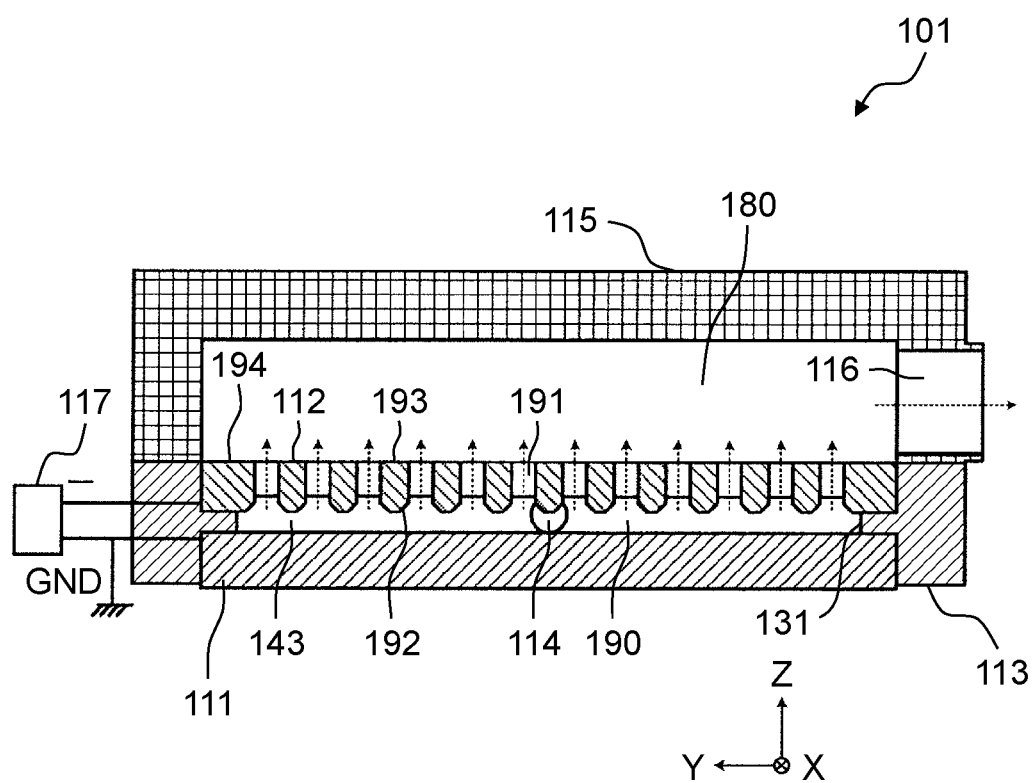
FIG. 4 is a cross-sectional view taken along the line I-I of FIG. 2, illustrating the heat receiving unit according to the first exemplary embodiment.

FIG. 4 is a cross-sectional view taken along the line I-I of FIG. 2, illustrating the heat receiving unit.

Figure 5:
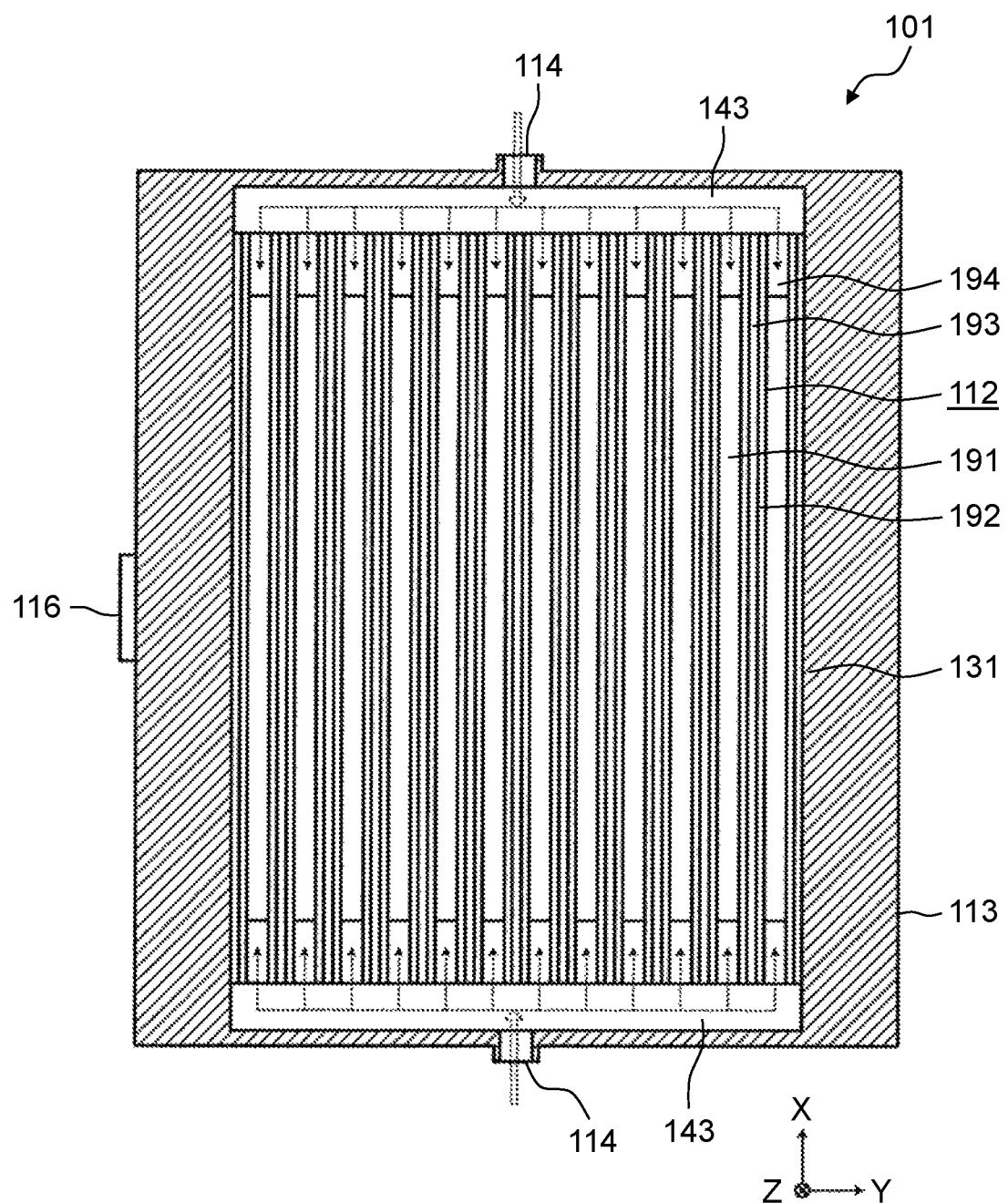
FIG. 5 is a cross-sectional view taken along the line III-III of FIG. 2, illustrating the heat receiving unit according to the first exemplary embodiment.

FIG. 5 is a cross-sectional view taken along the line III-III of FIG. 2, illustrating the heat receiving unit according to the first exemplary embodiment.

As illustrated in FIGS. 2 to 5, heat receiving unit 101 is a device that is in direct or indirect contact with heating element 200 and is capable of transferring heat released from heating element 200 to a working fluid to facilitate vaporization of the working fluid. Heat receiving unit 101 includes first member 111, second member 112, inlet housing 113, inlet ports 114, outlet housing 115, outlet port 116, and application unit 117.

First member 111 is directly or indirectly connected to heating element 200 and transfers heat from heating element 200 to a working fluid flowing internally. First member 111 is also an electrically conductive member that generates an electric field between first member 111 and second member 112 and functions as an electrode. First member 111 is not limited to any particular shape. In the present exemplary embodiment, first member 111 is shaped as a rectangular plate. First member 111 is preferably made of material having high electrical conductivity and high thermal conductivity. Examples of the material of first member 111 include copper, aluminum, and other metal, and alloys of copper, aluminum, and other metal. In the present exemplary embodiment, copper is used as the material of first member 111.

In the present exemplary embodiment, a surface of first member 111 facing second member 112 is a roughened surface covered with microscopic asperities. The roughened surface promotes formation of bubbles in the working fluid, and thus facilitates vaporization of the working fluid. The method for roughening the surface of first member 111 is not limited to any particular method. Examples of the method include a method in which the surface of first member 111 is processed using a shot peening procedure, for example, and a method in which the surface is roughened by being coated (electrodeposition) with powder of diamond or other high thermal conductive material.

Second member 112 is disposed to face first member 111 at a predetermined distance. Second member 112 is an electrically conductive member that generates a predetermined electric field between first member 111 and second member 112, and functions as an electrode. Second member 112 is a member through which a working fluid filled between first member 111 and second member 112 passes. Second member 112 has tapered portions 192 and slits 191. The spacing between adjacent tapered portions 192 gradually increases toward first member 111. Slits 191 are through-slits through which the working fluid passes.

In the present exemplary embodiment, when viewed as a whole, second member 112 is shaped as a rectangular plate, which is substantially the same shape as first member 111. Second member 112 includes fence portions 193 arranged in parallel with each other at predetermined intervals, and frame portion 194 shaped as a rectangular loop and integrally holding fence portions 193. Second member 112 may be made of any electrically conductive material, and is not limited to particular material. As in the case of the material of first member 111, second member 112 may employ copper, aluminum, or other metal, or an alloy of copper, aluminum, or other metal. In the present exemplary embodiment, stainless steel is used as the material of second member 112.

Figure 6:
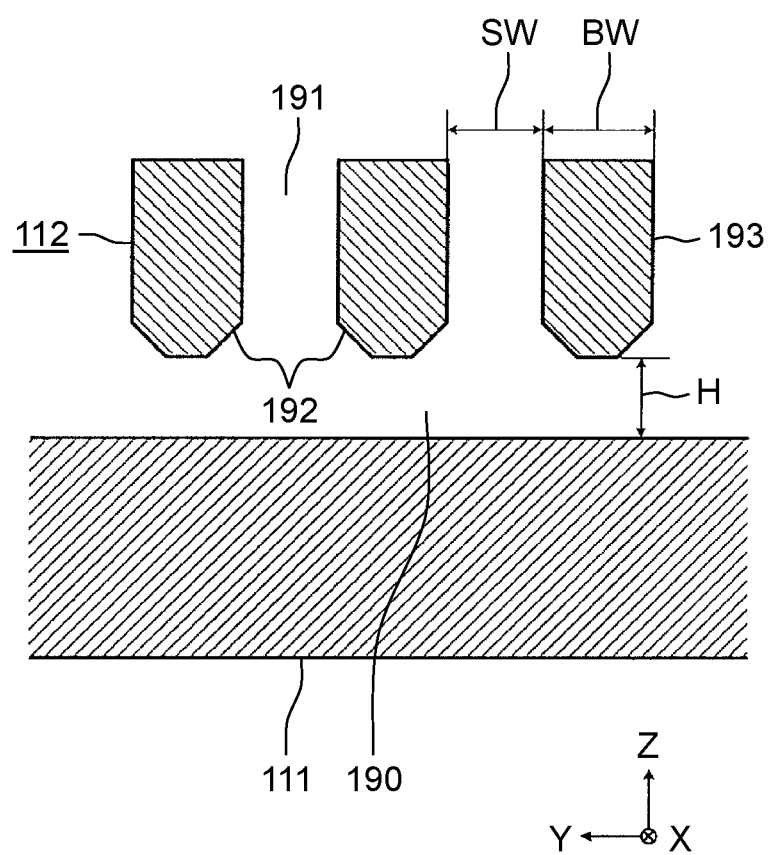
FIG. 6 is a cross-sectional view illustrating relationship between a first member and a second member according to the first exemplary embodiment.

FIG. 6 is a cross-sectional view illustrating relationship between the first member and the second member. As illustrated in FIG. 6, distance H between first member 111 and second member 112 is less than slit width SW, and is also less than width BW of fence portions 193. Actual distance H differs depending on voltage applied between the electrodes and a working fluid flow rate, and thus is not limited to any particular distance. In the present exemplary embodiment, distance H is selected from a range from 0.5 mm to 1.5 mm, inclusive.

Relationship between width BW of fence portions 193 and slit width SW is also not limited to any particular relationship. In the present exemplary embodiment, slit width SW is selected from a range from 80% to 200% of width BW of fence portions 193, inclusive. This is because slit width SW less than 80% of width BW of fence portions 193 would lead to a non-negligible flow resistance of the working fluid, while slit width SW exceeding 200% of width BW would reduce the effect of promoting vaporization of the working fluid, resulting in a failure to achieve a desired effect of heat receiving unit 101.

Slits 191 are long and narrow holes formed between fence portions 193 to pass through second member 112. A vaporized working fluid passes through slits 191. In the present exemplary embodiment, slits 191 have longer sides extending in an X-axis direction and shorter sides extending in a Y-axis direction in FIG. 6. A direction in which a working fluid flows into vaporization space portion 190 is in parallel with the direction (the Y-axis direction in FIG. 6) in which slits 191 are arranged. A working fluid in a liquid state may pass through slits 191, and a vaporized working fluid may also pass through slits 191 as bubbles together with the liquid working fluid. Tapered portions 192 are formed at a side of slits 191 facing first member 111. The spacing between adjacent tapered portions 192 gradually increases toward first member 111.

In the present exemplary embodiment, tapered portions 192 are formed by chamfering shoulder portions of rectangular cross-section fence portions 193 on a side facing first member 111 as illustrated in FIG. 6. In this configuration, when voltage is applied between first member 111 and second member 112, a potential difference occurs between first member 111 and second member 112 to generate an electrostatic stress between fence portions 193 and first member 111, creating a pressure difference between fence portions 193 and slits 191. This pressure difference allows bubbles generated in the working fluid to be guided toward slits 191 having a lower pressure. Furthermore, as illustrated in FIG. 6, the presence of tapered portions 192 produces a gradient in the electric field generated between first member 111 and second member 112. The electric field gradient produces a pressure difference in fence portions 193 as well, allowing the bubbles to be guided from a center of each fence portion 193 toward outside. The electrostatic stress occurs based on the potential difference. Thus it doesn't matter which of first and second members 111 and 112 serves as a positive electrode and which serves as a negative electrode.

Inlet housing 113 is disposed between second member 112 and first member 111, keeps second member 112 and first member 111 at a predetermined distance away from each other, and forms vaporization space portion 190 between second member 112 and first member 111 (see FIGS. 4 and 6).

In the present exemplary embodiment, inlet housing 113 has spacer portion 131 that keeps first member 111 and second member 112 at the predetermined distance away from each other and maintains electrical isolation between first member 111 and second member 112. Inlet housing 113 is a rectangular-loop frame body that holds a periphery of first member 111 and a periphery of second member 112 in a fluid tight manner.

Inlet ports 114 are openings provided in inlet housing 113 to communicate with vaporization space portion 190. Inlet ports 114 are holes through which a working fluid is introduced into vaporization space portion 190. The positions of inlet ports 114 are not limited to any particular place. In the present exemplary embodiment, inlet ports 114 are disposed in such a manner that directions of a working fluid passing through inlet ports 114 are along the direction (the X-axis direction in FIG. 4) in which the working fluid flows into vaporization space portion 190. Also, pipe member 104 illustrated in FIG. 1 is attached to inlet ports 114.

Figure 7:
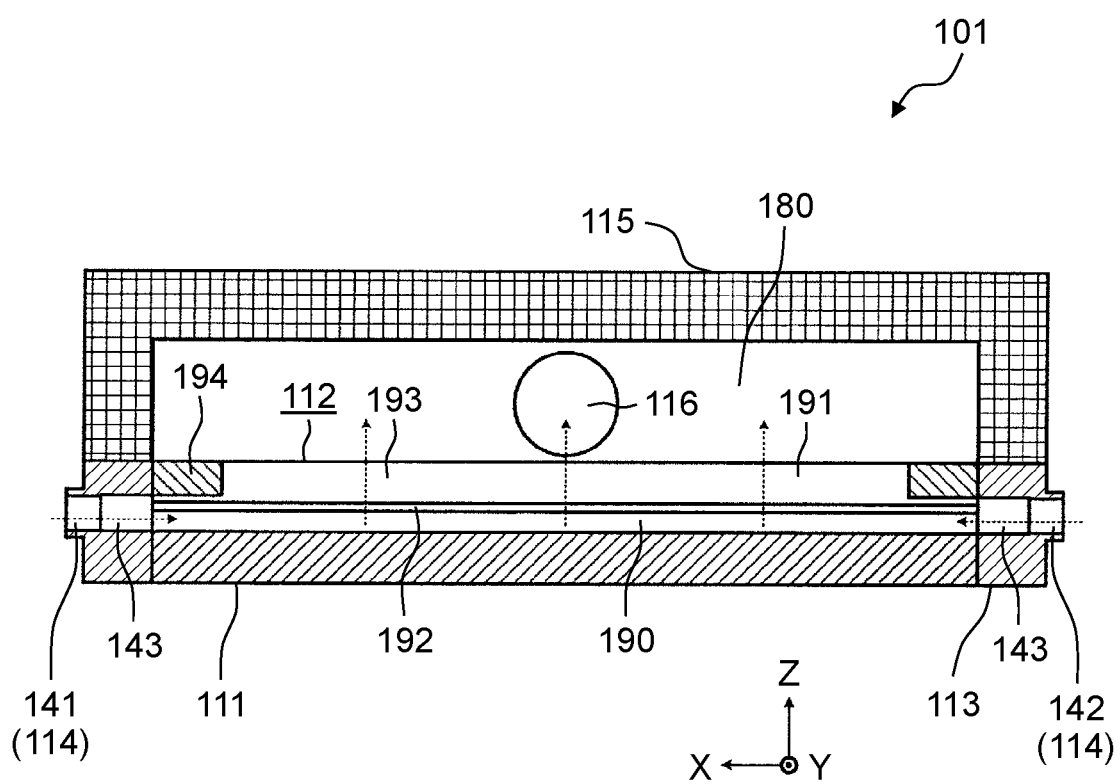
FIG. 7 is a cross-sectional view taken along the line II-II of FIG. 2, illustrating the heat receiving unit according to the first exemplary embodiment.

FIG. 7 is a cross-sectional view taken along the line II-II of FIG. 2, illustrating the heat receiving unit. As illustrated in FIG. 7, in the present exemplary embodiment, inlet ports 114 include first inlet port 141 and second inlet port 142. First inlet port 141 and second inlet port 142 are disposed in close proximity to respective opposite ends of slits 191 of second member 112 in such a manner that directions (the X-axis direction in FIG. 7) of a working fluid passing through the respective inlet ports face each other. Furthermore, buffer space portions 143 are provided between vaporization space portion 190 and inlet ports 114 to extend in a direction (the Y-axis direction in FIG. 7) that intersects the direction (the X-axis direction in FIG. 7) in which slits 191 extend, to allow the working fluid to easily flow along slits 191. Alternatively, it is also possible to provide inlet ports that communicate directly, not through buffer space portions 143, with a vaporization space portion.

Outlet housing 115 is a box-shaped member that forms outlet space portion 180 on the other side of second member 112 from vaporization space portion 190 (inlet housing 113). Outlet space portion 180 is space where a working fluid that has passed through respective slits 191 of second member 112 is temporarily stored. Since the vaporized working fluid enters outlet space portion 180, outlet space portion 180 is larger in capacity than vaporization space portion 190.

Outlet port 116 is an opening provided in outlet housing 115 to communicate with outlet space portion 180. Outlet port 116 is a hole through which a working fluid flows out of outlet space portion 180. The position of outlet port 116 is not limited to any particular place. In the present exemplary embodiment, outlet port 116 is disposed on a surface of outlet housing 115 that does not face second member 112, specifically, at a position where the direction (the X-axis direction in FIG. 7) in which slits 191 extend intersects the direction of the working fluid passing through outlet port 116. Also, pipe member 104 is attached to outlet port 116.

As illustrated in FIG. 3, application unit 117 is a device that applies a predetermined voltage between first member 111 and second member 112. In the present exemplary embodiment, application unit 117 is capable of applying a direct-current voltage, based on utility power, selected from a range from 1 kv to 10 kv, inclusive, between first member 111 and second member 112. Application unit 117 is only required to produce a potential difference between first member 111 and second member 112. Thus, positive voltage may be applied to both electrodes, negative voltage may be applied to both electrodes, and one of the electrodes may be connected to a ground. In the present exemplary embodiment, the first member is connected to a ground (GND), and negative voltage is applied to the second member.

The working fluid may be any fluid capable of transferring, to radiator 102, heat received from heating element 200 through heat receiving unit 101 for dissipation of the heat, and is not limited to any particular fluid. Examples of preferable properties of the working fluid include boiling at temperatures lower than an allowable maximum temperature of heating element 200. For example, when heating element 200 is desired to be kept at 60° C. or less, a working fluid with a boiling point of less than 60° C. is preferably employed. Also, in view of safety, a nonflammable working fluid or a working fluid having low flammability is preferably employed, and a working fluid having low toxicity is preferred.

Specifically, examples of the working fluid include a hydrofluorocarbon (HFC)-based solvent and a hydrofluoroether (HFE)-based solvent.

The following describes how cooling device 100 operates.

Pump 103 forces the working fluid to circulate in cooling device 100, fans 121 are rotated to cause air to flow to radiator 102, and application unit 117 applies voltage between first member 111 and second member 112.

Heat released from heating element 200 is transferred to the working fluid in vaporization space portion 190 through first member 111, and the working fluid boils in vaporization space portion 190. Bubbles formed by the boiling tend to stay between first member 111 and second member 112 due to the surface tension. However, a gradient in the electric field generated between first member 111 and tips of fence portions 193 of second member 112 produces an electrostatic stress directed toward the inside of slits 191 at the gas-liquid interface between the vapor and liquid of the working fluid, that is, at the surface of the bubbles. Furthermore, pump 103 produces pressure, conveying the bubbles of the working fluid from vaporization space portion 190 to outlet space portion 180 through slits 191 together with the working fluid in a liquid state. In this way, the working fluid is always supplied on the surface (boiling surface) of first member 111 facing second member 112 to promote boiling, enabling improvements in heat transfer rate.

On the other hand, the working fluid as the gas-liquid mixture reaches radiator 102 to exchange heat with the atmosphere. As a result, the liquid working fluid is cooled, and the gaseous working fluid is condensed back to a liquid.

The cooled liquefied working fluid is returned back to vaporization space portion 190 of heat receiving unit 101.

As described above, in cooling device 100 equipped with heat receiving unit 101, the electric field applied between first member 111 and second member 112 of heat receiving unit 101 continuously forces discharge of the bubbles of the boiling working fluid into outlet space portion 180 through slits 191. This forced discharge suppresses an occurrence of a "dry out" phenomenon in which bubbles are trapped on a surface of first member 111, and thus creates a state in which the liquid working fluid is widely distributed on the surface of first member 111. Accordingly, the working fluid is vaporized in a larger area, enabling effective cooling of heating element 200 using the latent heat of vaporization.

Second Exemplary Embodiment

An exemplary embodiment of a projector including cooling device 100 is described below. In the following, components (parts) that are similar or identical in function, feature, shape, mechanism, and structure to the components (parts) of the first exemplary embodiment are denoted by the same reference numerals, and descriptions of those components may be omitted. The following mainly describes differences from the first exemplary embodiment, and description of the same content may be omitted.

Figure 8:
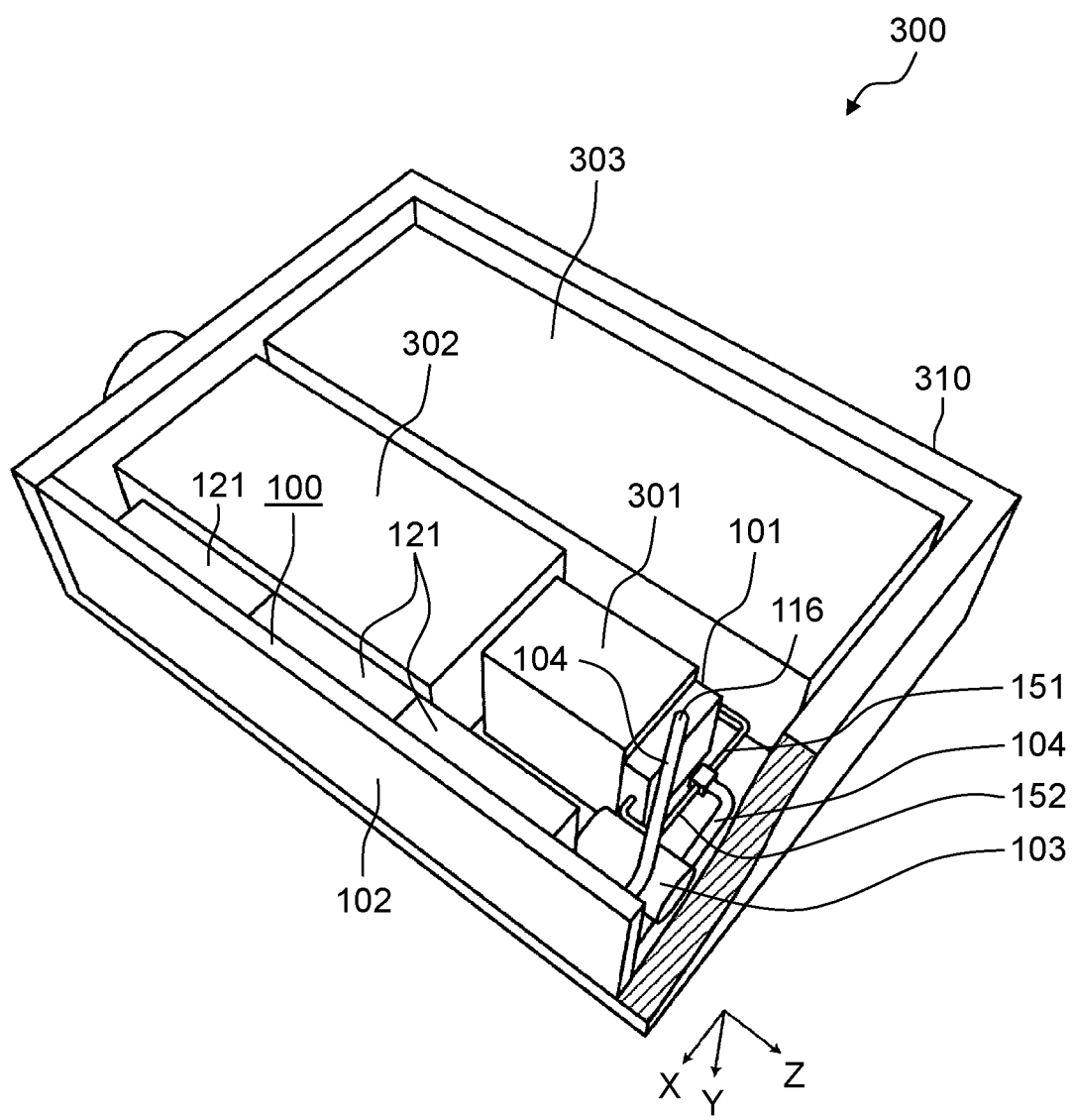
FIG. 8 is a perspective, partially cut-away view illustrating an interior of a projector according to a second exemplary embodiment.

FIG. 8 is a perspective, partially cut-away view of an interior of the projector. As illustrated in FIG. 8, projector 300 is a device that projects an image based on an input video signal on a screen or a structure, for example. Projector 300 includes laser source 301, light emitting portion 302, and projection portion 303. In the present exemplary embodiment, projector 300 is a high-intensity device used for projection mapping, for example.

Laser source 301 is a semiconductor device that emits laser beams, such as blue light and ultraviolet light, as excitation light for emission of white light in light emitting portion 302. In the present exemplary embodiment, laser source 301 is capable of simultaneous oscillation of a plurality of laser beams for the emission of high-intensity white light.

Light emitting portion 302 is a device capable of emitting light based on the laser beams from laser source 301. The emitted light has a different wavelength than the laser beams. In the present exemplary embodiment, light emitting portion 302 includes phosphors that use the laser beams emitted from laser source 301 as excitation light and emit fluorescent light at wavelengths longer than the wavelengths of the laser beams. Combining the multiple phosphors allows the emission of artificial white light.

Projection portion 303 is a device that projects an image based on the white light from light emitting portion 302 on a screen or a structure, for example. Projection portion 303 includes a processing unit for imaging of an input video signal, and an optical system for projection of the image, for example.

Projector 300 further includes cooling device 100. Cooling device 100 is a system that cools laser source 301, which is heating element 200, and includes heat receiving unit 101, radiator 102, and pump 103. Application unit 117 is included in a power supply (not shown) of projector 300. Thus the power supply of projector 300 supplies voltage to be applied between first member 111 and second member 112 (see FIG. 4).

Radiator 102 is disposed across almost an entire side surface of rectangular housing 310, which functions as an outer shell of projector 300. A plurality of fans 121 are attached inside housing 310.

Figure 9:
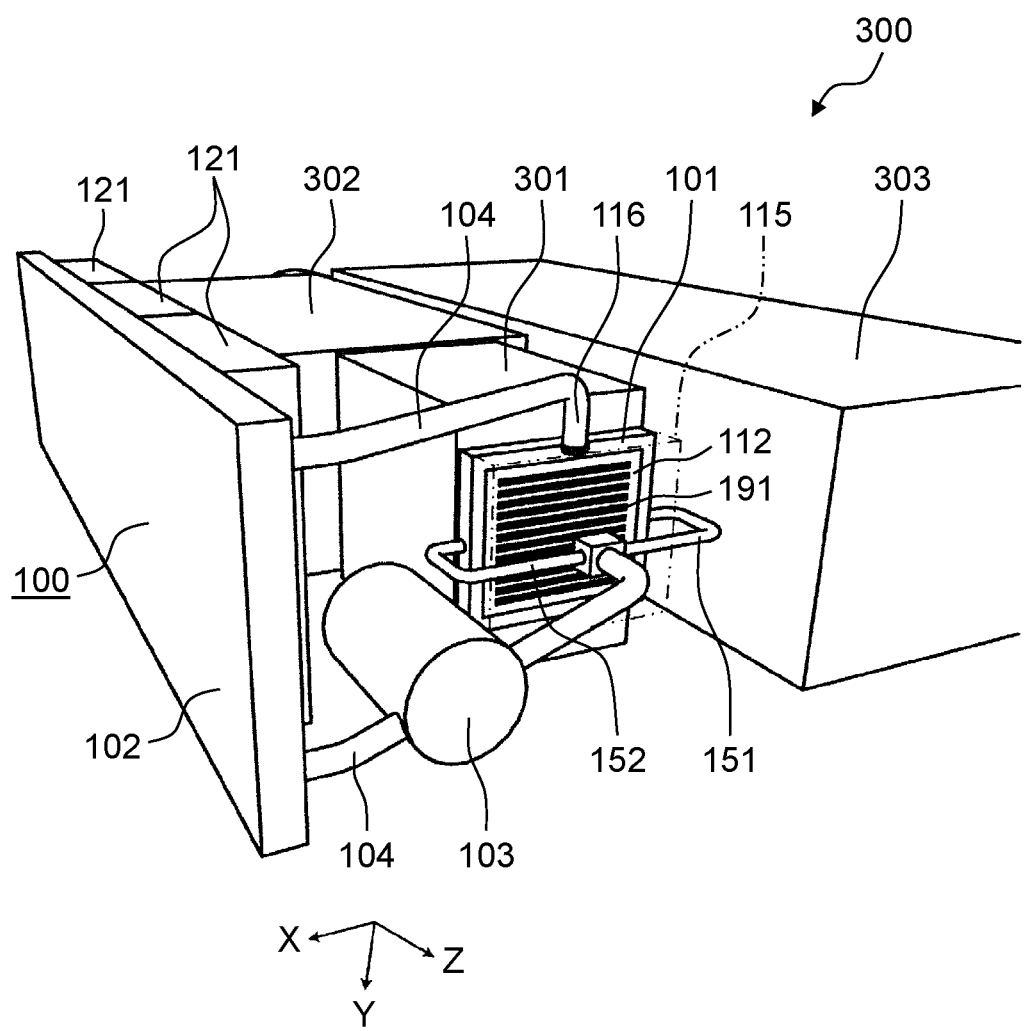
FIG. 9 is a perspective view of the projector according to the second exemplary embodiment, illustrating a part near a heat receiving unit of a cooling device in the projector, with an outlet housing omitted.

FIG. 9 is a perspective view of the projector, illustrating a part near the heat receiving unit of the cooling device in the projector, with an outlet housing omitted. As illustrated in FIG. 9, heat receiving unit 101 is attached to laser source 301. A surface of heat receiving unit 101 at which first member 111 (see FIG. 7) is exposed is in contact with a side surface of laser source 301. In the present exemplary embodiment, an insulating heat-conduction sheet (not shown) having high thermal conductivity is disposed between heat receiving unit 101 and laser source 301.

Second member 112 of heat receiving unit 101 is disposed alongside first member 111. Specifically, first member 111 and second member 112 facing each other are disposed side-by-side in the Z-axis direction in FIG. 9, and heat receiving unit 101 is vertically arranged as a whole. Slits 191 of second member 112 extend in a uniaxial direction (the X-axis direction in FIG. 9) in a horizontal plane, and are disposed in such a manner that the direction in which slits 191 pass through second member 112 is a direction (the Z-axis direction in FIG. 9) toward the first member.

Pipe member 104 is divided into first branch path 151 and second branch path 152 immediately before inlet ports 114. First branch path 151 and second branch path 152 are respectively connected to first inlet port 141 and second inlet port 142 (see FIG. 7).

This configuration enables the working fluid to flow into vaporization space portion 190 from both ends of slits 191 through buffer space portions 143 in the direction in which slits 191 extend, thereby effectively promoting vaporization of the working fluid. This is achievable without buffer space portions 143 (see FIG. 7).

Outlet port 116 is provided at an upper end of outlet housing 115. Thus, bubbles that have passed through slits 191 rise in outlet space portion 180 and are smoothly discharged from outlet port 116. This configuration also allows the bubbles of the working fluid to reach radiator 102 and liquefy efficiently, thereby improving the efficiency of overall cooling device 100. Since the vaporized working fluid enters outlet space portion 180, outlet space portion 180 is larger in capacity than vaporization space portion 190 (see FIG. 7).

The present disclosure should not be limited to the exemplary embodiments described above. For example, another exemplary embodiment according to the present disclosure may be implemented by freely combining components described herein or excluding some of the components. The scope of the present disclosure should include any modifications obtainable through various changes to the above exemplary embodiments that can be conceived by those skilled in the art without deviating from the spirit of the present disclosure, that is, the meaning of the wording as defined by the appended claims.

For example, corners of fence portions 193 facing first member 111 are chamfered at an angle of approximately 45 degrees to form tapered portions 192 of slits 191. The angle of the chamfering, however, is not limited to any particular angle. Tapered portions 192 may also be formed by curved-surface chamfering, that is, a so-called R-chamfering, instead of flat-surface chamfering, that is, a so-called C-chamfering.

In the second exemplary embodiment, there has been described, as an example, projector 300 including cooling device 100. Applications of cooling device 100, however, are not limited to projector 300, but cooling device 100 may also be applied to computers and other electronic devices.

Also, cooling device 100 may include a plurality of heat receiving units 101. In that case, heat receiving units 101 may be connected in parallel or in series.

In the above description, radiator 102 exchanges heat with air (the atmosphere), but may exchange heat with water or other liquid fluid.

Figure 10:
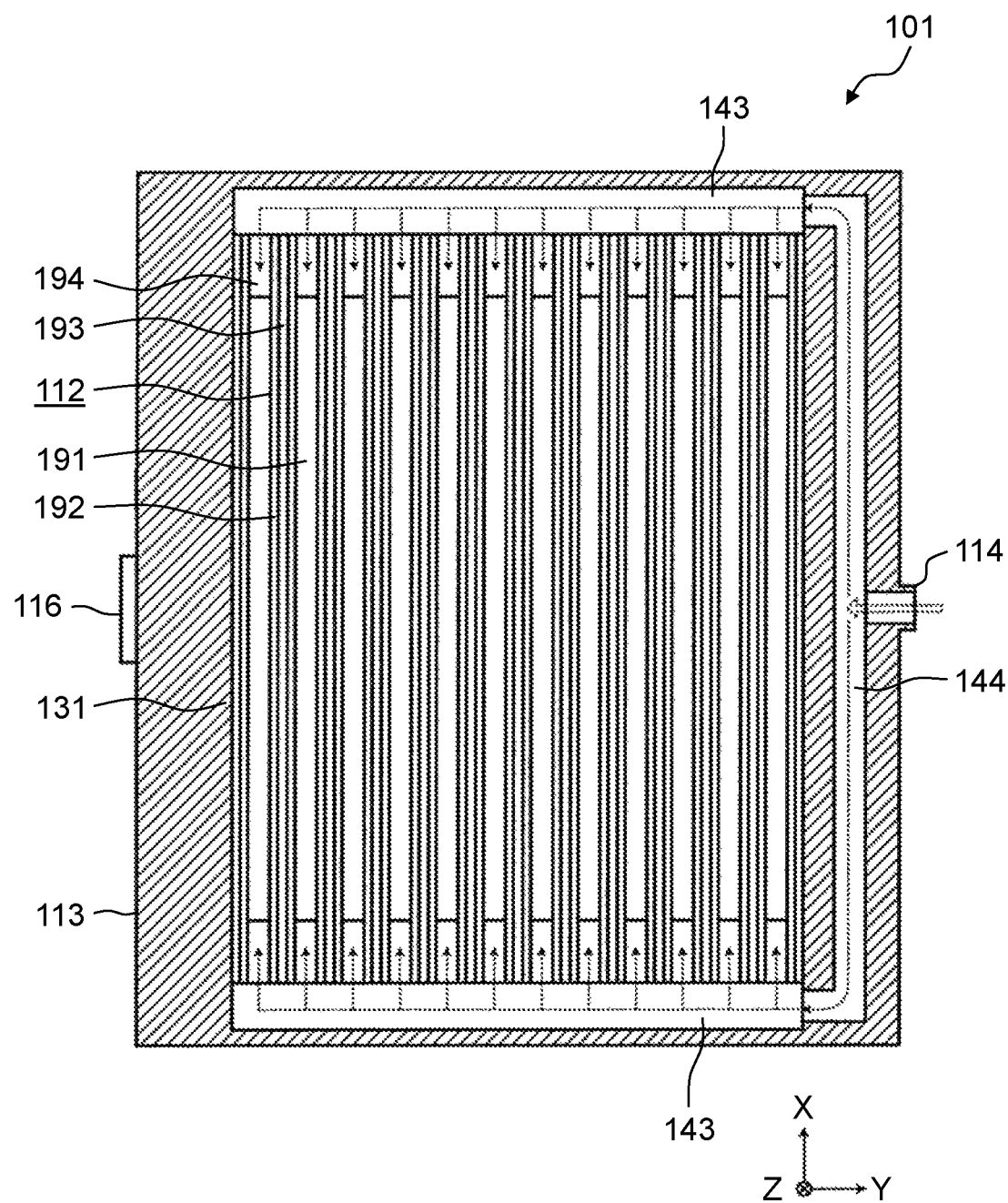
FIG. 10 is a cross-sectional view, equivalent to the cross-section of FIG. 5, illustrating a heat receiving unit according to another exemplary embodiment.

FIG. 10 is a cross-sectional view, equivalent to the cross section of FIG. 5, illustrating a heat receiving unit according to another exemplary embodiment. As illustrated in FIG. 10, inlet housing 113 has one inlet port 114, and branch path 144 that branches a working fluid may be provided in inlet housing 113. As in this case, a direction of the working fluid passing through inlet port 114 may intersect (at right angles in the configuration of FIG. 10) a direction of the working fluid flowing into vaporization space portion 190 (see FIG. 7).

In the foregoing description, slits 191 have a rectangular shape in plan view. The shape of slits 191 in plan view, however, is not limited to any particular shape.

Also, the terms "longer sides" and "shorter sides" are used for slits 191. However, when the shape of slits 191 is not rectangular, longer sides and shorter sides of an imaginary minimum rectangular area surrounding each such slit 191 in plan view may correspond to the "longer sides" and "shorter sides" used in the foregoing description. When slits 191 are square in shape, the sides of the square may be considered to be either longer or shorter sides.

Also, some members of heat receiving unit 101 may be integrated into one unit to reduce the parts count. For example, inlet housing 113 need not be separate from, but may be integral with, outlet housing 115.

INDUSTRIAL APPLICABILITY

A cooling device according to the present disclosure has high cooling efficiency, and is suitably applied to cooling of high-density, high-performance electronic components that thus generate a great amount of heat, for example.

REFERENCE MARKS IN THE DRAWINGS

100: cooling device
101: heat receiving unit
102: radiator
103: pump
104: pipe member
111: first member
112: second member
113: inlet housing
114: inlet port
115: outlet housing
116: outlet port
117: application unit
121: fan
131: spacer portion
141: first inlet port
142: second inlet port
143: buffer space portion
151: first branch path
152: second branch path
180: outlet space portion
190: vaporization space portion
191: slit
192: tapered portion
193: fence portion
194: frame portion
200: heating element
300: projector
301: laser source
302: light emitting portion
303: projection portion
310: housing

The invention claimed is:

1. A cooling device comprising:
a heat receiving unit configured to receive heat from a heating element;
a working fluid for transferring the heat received by the heat receiving unit;
a radiator configured to cool the working fluid from the heat receiving unit;
a pump configured to transport, to the heat receiving unit, the working fluid discharged from the radiator; and
an application unit,
wherein the heat receiving unit includes:
a first member configured to receive the heat from the heating element and vaporize the working fluid;
a second member disposed to face the first member and having slits disposed in the second member;
an inlet housing connected to the pump and disposed between the first member and the second member; and
an outlet housing connected to the radiator and disposed on a side of the second member facing away from the inlet housing,
wherein:
the first member and the second member are disposed at a predetermined distance away from each other, and a vaporization space portion is disposed between the first member and the second member;
an outlet space portion is disposed on a side of the second member facing away from the vaporization space portion;
each of the first member and the second member is an electrode, and the application unit is configured to apply voltage to the first member and the second member.

2. The cooling device according to claim 1, wherein:
each of the slits has a longer side and a shorter side; and
a direction in which the working fluid is to flow into the second member is in parallel with a direction in which the slits are arranged.

3. The cooling device according to claim 2, wherein the second member has tapered portions having a spacing between adjacent ones of the tapered portions, the spacing increasing in a direction toward the first member.

4. The cooling device according to claim 1, wherein the outlet space portion is larger in capacity than the vaporization space portion.

5. A projector comprising:
a laser source configured to emit a laser beam;
a light emitting portion configured to emit light based on the laser beam from the laser source, the light having a different wavelength than a wavelength of the laser beam;
a projection portion configured to project an image based on the light from the light emitting portion;
a cooling portion configured to cool the laser source; and
an application unit,
wherein the cooling portion includes:
  a heat receiving unit configured to receive heat from a heating element;
  a working fluid for transferring the heat received by the heat receiving unit;
  a radiator configured to cool the working fluid from the heat receiving unit; and
  a pump configured to transport, to the heat receiving unit, the working fluid discharged from the radiator,
wherein the heat receiving unit includes:
  a first member configured to receive the heat from the heating element and vaporize the working fluid;
  a second member disposed to face the first member and having slits disposed in the second member;
  an inlet housing connected to the pump and disposed between the first member and the second member; and
  an outlet housing connected to the radiator and disposed on a side of the second member facing away from the inlet housing,
wherein:
the first member and the second member are disposed at a predetermined distance away from each other, and a vaporization space portion is disposed between the first member and the second member;
an outlet space portion is disposed on a side of the second member facing away from the vaporization space portion;
each of the first member and the second member is an electrode, and
the application unit is configured to apply voltage to the first member and the second member.

6. The projector according to claim 5, wherein:
each of the slits has a longer side and a shorter side;
a direction in which the working fluid is to flow is in parallel with a direction in which the longer side of each of the slits extends; and
an inlet port included in the inlet housing is disposed along the direction in which the working fluid is to flow.

7. A heat receiving unit configured to be connected to a pump and configured to cool a heating element using a working fluid, the heat receiving unit comprising:
a first member configured to receive heat from the heating element and vaporize the working fluid;
a second member disposed to face the first member and having slits disposed in the second member;
an inlet housing configured to be connected to the pump and disposed between the first member and the second member; and
an outlet housing into which the working fluid is to be discharged, the outlet housing being disposed on a side of the second member facing away from the inlet housing,
wherein:
the first member and the second member are disposed at a predetermined distance away from each other, and a vaporization space portion is disposed between the first member and the second member;
an outlet space portion is disposed on a side of the second member facing away from the vaporization space portion;
each of the first member and the second member is an electrode, and
the first member and the second member are configured such that voltage is applied between the first member and the second member.

* * * * *